United States Patent [19]
Umemura et al.

[11] Patent Number: 5,462,442
[45] Date of Patent: Oct. 31, 1995

[54] MODULE FOR INFORMATION PROCESSING APPARATUS USING STACKED PRINTED CIRCUIT BOARDS AND CONNECTOR FOR STACKING PRINTED CIRCUIT BOARDS

[75] Inventors: Masaya Umemura, Fujisawa; Toshihiko Ogura; Hideki Osaka, both of Ebina; Masatsugu Shinozaki, Hadano, all of Japan

[73] Assignee: Hitachi, Ltd., Tokyo, Japan

[21] Appl. No.: 197,841

[22] Filed: Feb. 17, 1994

[30] Foreign Application Priority Data

Feb. 24, 1993  [JP]  Japan ................................... 5-035617

[51] Int. Cl.⁶ ................................................. H05K 1/00
[52] U.S. Cl. ............................ 439/69; 439/68; 439/654; 439/75
[58] Field of Search ..................... 439/65, 68, 44, 439/49, 53, 654, 655, 591, 76, 69, 74, 75

[56] References Cited

U.S. PATENT DOCUMENTS

| | | | |
|---|---|---|---|
| 3,838,317 | 9/1974 | Coyne | 439/49 OR |
| 5,064,378 | 11/1991 | Olson | 439/68 OR |
| 5,190,481 | 3/1993 | Ju | 439/654 OR |
| 5,242,319 | 9/1993 | Ju | 439/654 X |

FOREIGN PATENT DOCUMENTS 1-167973  7/1989  Japan.
1-313866  12/1989  Japan.

OTHER PUBLICATIONS

IEEE Compcon Spring 1992, tutorial #4, "Advances in Bus Architecture and Theory", FSCEM: Stacking Modules, and FSCEM: Mechanical by Paul L. Borrill.

Primary Examiner—Larry I. Schwartz
Assistant Examiner—Daniel Wittels
Attorney, Agent, or Firm—Antonelli, Terry, Stout & Kraus

[57] ABSTRACT

In a connector having a plurality of first contact groups arranged in a predetermined pattern, conductors whose one ends are connected to the first contact groups, and a plurality of second contact groups arranged in a pattern corresponding to the pattern of the first contact groups, the conductors for connecting the first contact groups and the second contact groups cause portions of the first contact groups to be connected to the second contact groups at different positions within the above-described pattern. Accordingly, even when the contacts of the same sort of signal lines having one-to-one correspondence are allocated to the contact conductors located at the same positions within the boards for constituting the respective modules, the one-to-one correspondence can be maintained, and thus the printed-circuit boards of the modules can be commonly utilized.

10 Claims, 12 Drawing Sheets

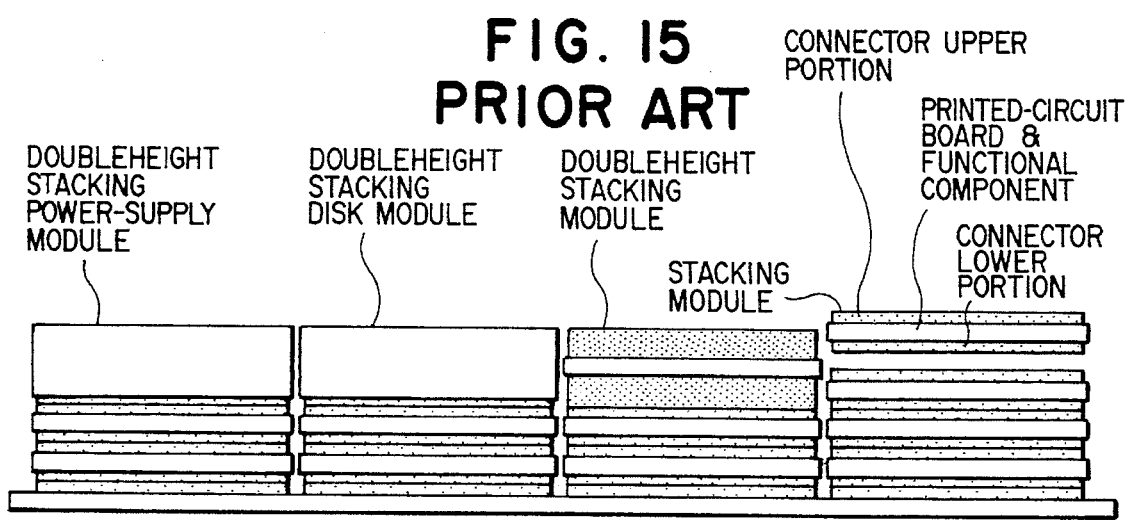

MODULE FOR INFORMATION PROCESSING APPARATUS USING STACKED PRINTED CIRCUIT BOARDS AND CONNECTOR FOR STACKING PRINTED CIRCUIT BOARDS

BACKGROUND OF THE INVENTION

The present invention relates to a module for an information processing apparatus and a connector employed therein.

The conventional connector having the engaging direction along two directions is realized as the connector for the stacking modules shown in FIG. 15 in the document #4 of IEEE COMPOSE SPRING Tutorial. In this drawing, the stacking modules are constructed of the connector upper portion, the connector lower portion, the printed-circuit board, and the functional component. As the stacking modules, there are also the doubleheight stacking module, the doubleheight stacking disk module, and the doubleheight stacking power-supply module, depending upon dimensions of the functional components. The connector upper portion and the connector lower portion are fabricated in such a structure that the connector upper portion can be engaged with the connector lower portion of other module stacked on the upper surface of this connector upper portion, and also the connector lower portion can be engaged with the connector upper portion of other module stacked on the lower surface of this connector lower portion. Then, these connector upper portion and connector lower portion are mutually engaged with other connectors to have a plurality of contact conductors for constituting contacts (engagement lines). The same number of contact conductors are arranged at the same pitch in each of these modules. The contact conductors of the connector upper portion and of the connector lower portion own paired structures with respect to the connector lower portion of other module and the connector upper portion thereof.

SUMMARY OF THE INVENTION

In general, control signal lines such as bus request, clock, and interrupt should be connected to each other while keeping the one-to-one correspondence when the respective modules are connected to each other. To this end, when the signal lines for the bus request signals are realized with keeping the one-to-one correspondence, these signal lines are allocated to the respective different contacts for every stacking module, in order to avoid conflict, or bus fight. That is, in the module including the connector having the above-described structure, the signal lines such as the bus request signal with the one-to-one correspondence are allocated to the different contacts of the connector for sorts of signals.

However, in case that a plurality of modules are sequentially stacked via the connectors, if more than two modules where the same sort of signal lines are connected to the contacts at the same position are coupled to each other, since the positions of the contacts are identical to each other, the same sort of signals appearing on the signal lines conflict with each other. As a consequence, the principle on the one-to-one correspondence for the signal lines can no longer be maintained.

To avoid such a conflict signal condition, the positions of the contacts are different from each other. However, there is another problem that even in the contacts for the same sort of signals, since the positions of these contacts are different from each other in the respective modules, the printed-circuit boards of the modules to be engaged with each other cannot be commonly utilized, resulting in a large number of sorts for the printed-circuit boards.

An object of the present invention is to provide a module for an information apparatus and a connector employed in this module, wherein even when the same sort of signal lines having one-to-one correspondence would be allocated to the contacts located at the same position, such a one-to-one correspondence can be maintained, and also printed-circuit boards of modules can be commonly utilized.

To achieve the above-described object, according to one aspect of the present invention, it may be provided with a connector comprising: a plurality of first contact groups arranged in a predetermined pattern; conductors whose one ends are connected to said first contact groups; and a plurality of second contact groups arranged in a pattern corresponding to said pattern of the first contact groups, wherein said conductors for connecting said first contact groups and said second contact groups cause a portion of said first contact groups to be connected with said second contact groups at different positions within said pattern.

According to another aspect of the present invention, it may be provided with a module for an information apparatus comprising a connector and a printed-circuit board on which said connector is mounted said connector including a plurality of first contact groups arranged in a predetermined pattern, conductors whose one ends are connected to said first contact groups, and a plurality of second contact groups arranged in a pattern corresponding to said pattern of the first contact groups, wherein: said conductors for connecting contacts of said first contact groups with contacts of said second contact groups, are subdivided into first conductors derived from said contacts of said first contact groups and second conductors derived from said contacts of said second contact groups; said printed-circuit board has via holes and printed conductors, which connect the conductors of said connector with said printed-circuit board, at a portion on which said connector is mounted; and said first conductors and said second conductors are mutually connected via said via holes to each other, and portions of said first and second conductors cause portions of said first contact groups to be connected to said second contact groups at different position within said pattern.

Furthermore, according to another aspect of the present invention, it may be provided with a module for an information apparatus comprising a connector and a printed-circuit board on which said connector is mounted, said connector including a plurality of first contact groups arranged in a predetermined pattern, conductors whose one ends are connected to said first contact groups, and a plurality of second contact groups arranged in a pattern corresponding to said pattern of the first contact groups, wherein: said printed-circuit board includes through holes and printed conductors, which are used to connect both of said connector and said printed-circuit board to positions to which said connector is mounted; said conductors for connecting said first contact groups and said second contact groups are penetrated via said through holes from one side of said printed-circuit board to the other side of said printed-circuit board, and portions of said first contact groups and said second contact groups are connected to each other in such a manner that a positional relationship of an arrangement of one contact portion is different from another positional relationship of an arrangement of the other contact portion within said predetermined pattern.

Moreover, according to a further aspect of the present invention, it may be provided with a printed-circuit mother board comprising: a plurality of module boards; and a plurality of slots for mounting said module boards thereon, wherein said printed-circuit mother board includes a plurality of printed conductors connected while the same positional relationship is maintained at the respective slots, and a plurality of printed conductors whose connection positions are sequentially shifted for each slot.

The first and second contact groups may be mutually connected to contact groups of other connectors. As a result, the modules constructed by mounting this connector on the board are connected by employing this connector in such a manner that these modules are successively stacked. Also, a plurality of contact portions arranged in a predetermined pattern are in contact with contact groups of other connector (will be referred to "contact portions"), thereby constituting the connector. As a consequence, the modules are electrically connected with each other via the connectors.

The conductors for connecting one contact portions with the other contact portions, cause portions of one contact portions and of the other contact portions to be connected with each other in such a way that the positional relationship of the arrangements for one contact portions is different from the positional relationship of the arrangements for the other contact portions within a predetermined pattern. In other words, portions of the positional relationship between one contact portions and the other contact portions are shifted within the pattern of the contact portions.

This positional shift may be performed for, e.g., a single positional shift of the pin portion. With such a positional shift it is so condition that one connector is positionally shifted from the other connector by 1 contact, in comparison made between a section of one connector and a section of the other connector with respect to the position of the signal line.

Under such a condition that a plurality of modules are stacked, the positions of the signal lines connected to the contact portions to be positionally shifted are successively Shifted by performing this positional shift which these modules are successively stacked. Thus, when the signal lines which should own one-to-one correspondence for every module are allocated to these contact portions in accordance with the relationship between the number of positional shift and the number of stacked stage, the relevant signal lines are continuously connected to the contact portions at the same positions in the respective modules.

As a consequence, even when a plurality of stacking modules are coupled/engaged with each other, the one-to-one correspondence rule for the signal lines such as the bus request signals can be kept. Moreover the printed-circuit boards of the modules can be commonly utilized.

BRIEF DESCRIPTION OF THE DRAWINGS

The present invention will be apparent from the following detailed description, when taken in conjunction with the accompanying drawings, in which:

FIG. 15 is an explanatory diagram for indicating the stacking condition of the module with employment of the conventional two way engagement connector.

DESCRIPTION OF THE PREFERRED EMBODIMENTS

Referring now to drawings, a signal line connecting apparatus according to an embodiment of the present invention will be described.

Figure 1:
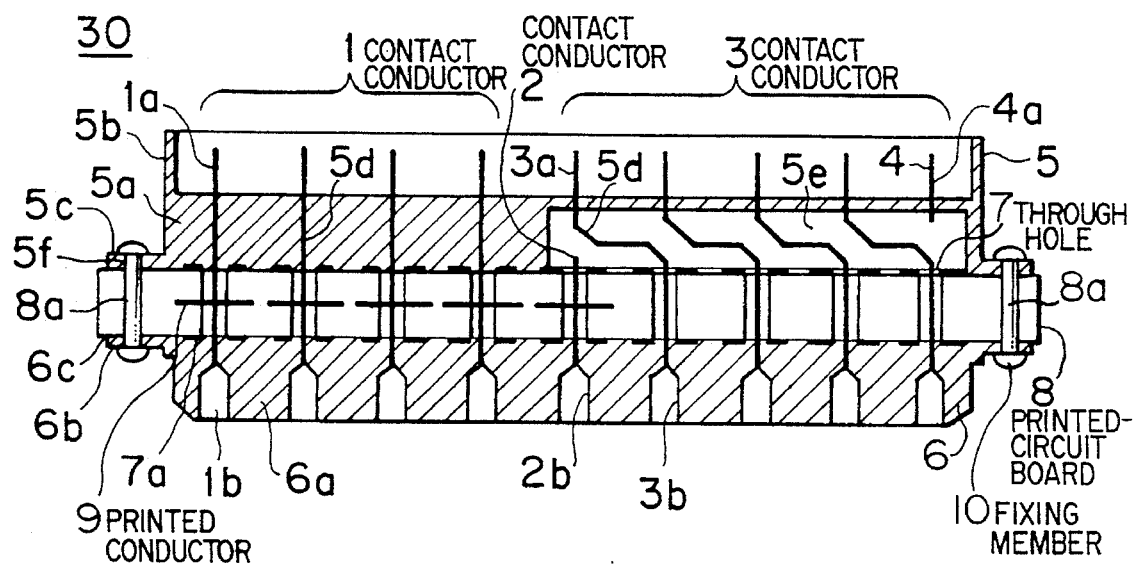
FIG. 1 is a sectional view for structures of a two-way engagement connector and a printed circuit board mounting the two-way engagement connector, which constitute a first embodiment of the present invention.
Figure 2A:
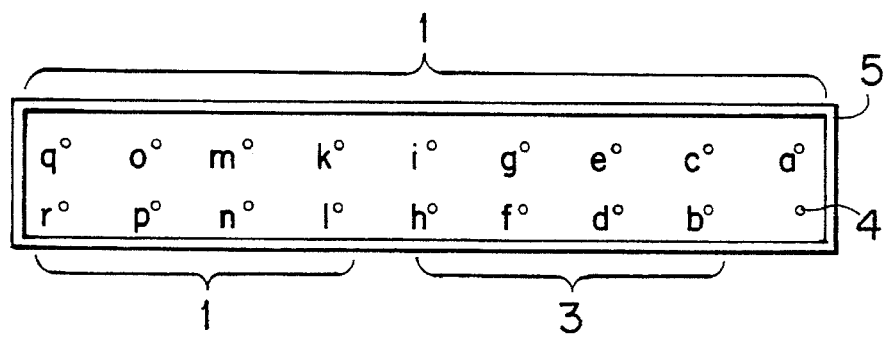
FIGS. 2A and 2B are explanatory diagrams for showing a pin-portion arrangement of the two-way engagement connector and a socket-portion arrangement thereof, as viewed on the pin-portion side, which constitute the first embodiment of the present invention.
Figure 2B:
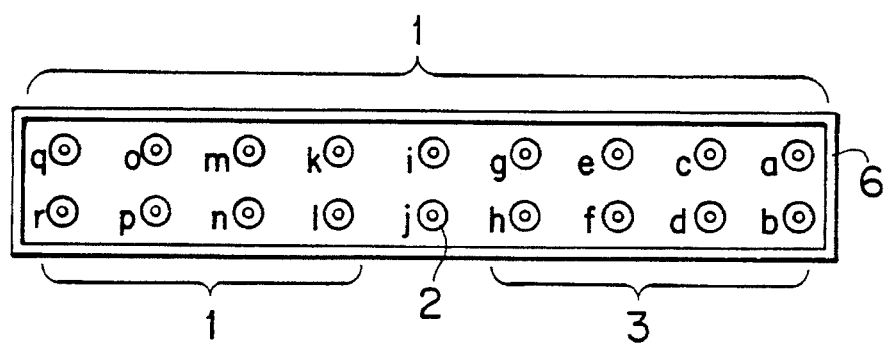
Figure 3:
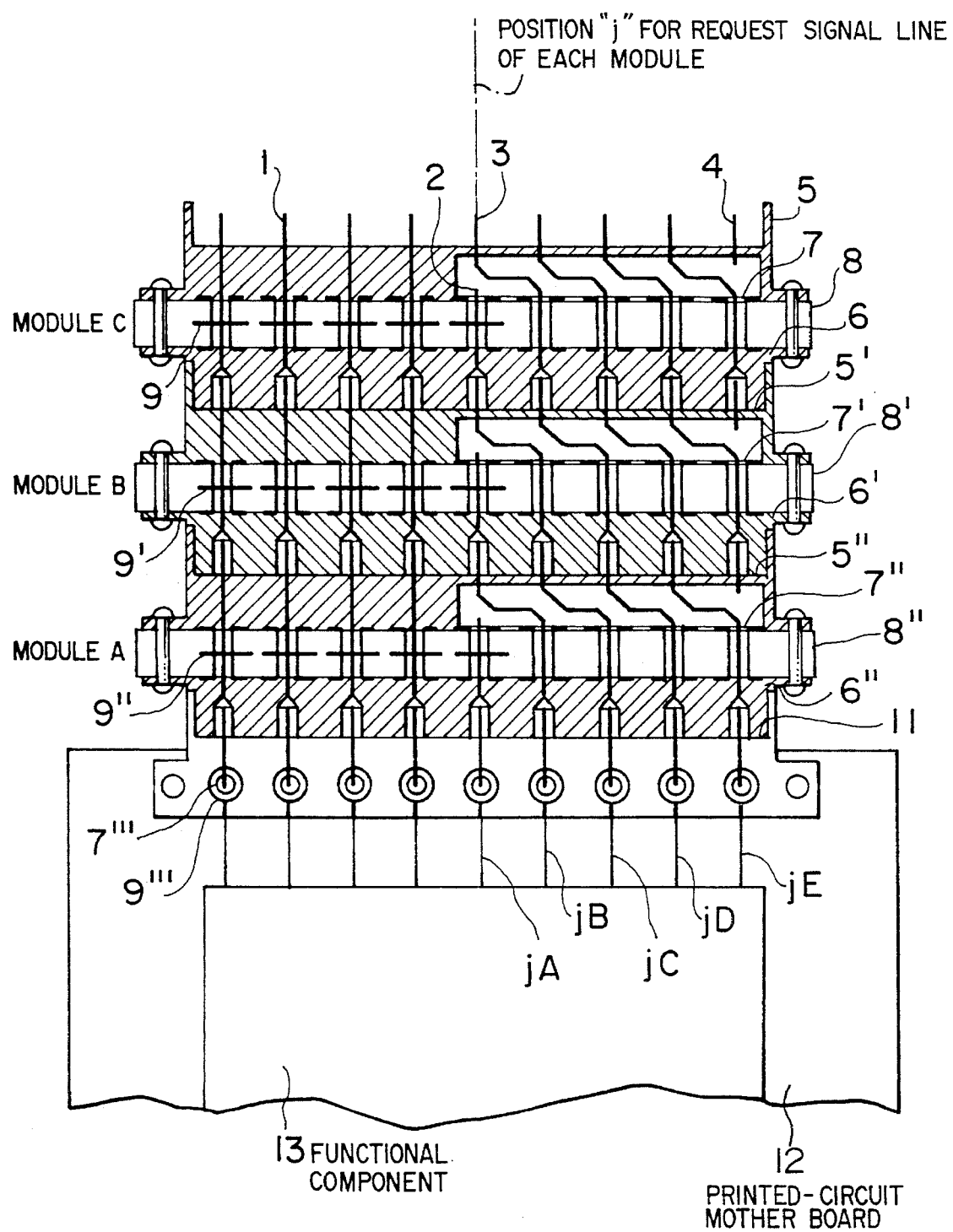
FIG. 3 is a sectional view of a major portion under condition that a plurality of modules are stacked with employment of the two-way engagement connector constituting the first embodiment of the present invention.

In FIGS. 1 to 3, there are shown a two-way engagement connector of a first embodiment to which the present invention has been applied. The first embodiment is such an example for constituting a module by mounting connectors (excluding a printed-circuit board 8) 30 on both surfaces of the printed-circuit board 8 on this printed circuit board 8. The connectors have engagement units in two directions along the normal line of these surfaces in order to be in contact with other connectors (contacts). In this embodiment, as indicated in FIG. 3, a plurality modules are mutually connected by way of the connectors to be stacked. FIG. 2 is a cross-sectional view for indicating a single module of the stacked modules. In FIG. 1, the connector according to this embodiment comprises contact conductors 1, 2, 3 and 4; insulating blocks 5 and 6 for fixing these contact conductors 1, 2, 3, 4 at a constant pitch and for constituting two engagement units used to be engaged with other connectors; and a fixing member 10 for fixing the insulating blocks 5, 6 by sandwiching the printed-circuit board 8 between these blocks.

The contact conductor 1 has a contact group 1a (will be referred to a "pin portion" 1a) provided on one side and another contact group 1b (will be referred to a "socket portion" 1b) provided on the other side, into which the pin portion 1a of the other contact conductor 1 connects. Both of the pin portion 1a and the socket portion 1b are integrally provided as a portion of the continuous contact conductor. At least portions of the plural contact conductors are connected to printed conductors 9 of the printed-circuit board 8.

A contact conductor 2 corresponds to a conductor to be terminated at this module. That is, the contact conductor 2 owns a socket portion 2b, but does not have a pin portion. With this structure, spurious radiation occurring from the terminated contact conductor can be prevented. This contact conductor 2 is connected to the printed conductor 9 of the printed-circuit board 8.

A contact conductor 3 has a pin portion 3a and a socket portion 3b, similar to the contact conductor 1. The pin portion 3a and the socket portion 3b are integrally formed as a portion of continuous contact conductor, similar to the contact conductor 1. This contact conductor 3 is not connected to the printed conductor 9 of the printed-circuit board 8 in this module. It should be noted that the above-explained contact conductors 1 and 3 are not limited to the pin portions and the socket portions, but may be any shapes of structures capable of being mutually in contact with each other.

A contact conductor 4 is a dummy conductor consisting of a pin portion and thus the dummy conductor is not used to transmit a signal. Accordingly, mounting of this contact conductor 4 may be omitted.

The insulating blocks 5 and 6 are made of a synthetic resin material such as thermosetting resin. The insulating blocks 5 and 6 are such structures that these blocks are mutually engaged with insulating blocks 6 and 5 of another connector in a manner as explained hereinafter.

The insulating block 5 includes a pin fixing portion 5a for fixing the pin portion, a frame portion 5b for forming a concave portion used to engage with other insulating block 6, and a flange portion 5c for coupling the insulating block 6 and the printed-circuit board 8 to fix them to this flange portion 5c. A plurality of pin holes 5d for fixing the contact conductors 1, 3 and 4 are provided on the pin fixing portion 5a. This pin hole 5d is formed as a predetermined pattern in order to arrange the pin portions 1a, 3a and 4a. Normally, these pin holes are arranged in such a manner that either a single column, or more than two columns of pin holes are positioned at a constant pitch. Within a portion of the pin fixing portion 5a, a hollow portion 5e is provided by which an intermediate portion of the contact conductor 3 is folded and shifted to the adjoining pin hole 5d. A mounting hole 5f for penetrating the fixing member 10 therethrough is provided on the flange portion 5c.

On the other hand, the insulating block 6 has a convex portion 6a for fixing the socket portion and engaging the frame portion 5b used to form a concave portion of the insulating block 5 of other connector; and a flange portion 6b for coupling the insulating block 5 and the printed-circuit board 8 to be fixed with each other. A mounting hole 6c for penetrating the fixing member 10 is provided on the flange portion 6b.

In the insulating block 5, the pin portions 1a, 3a, 4a are sequentially arranged in a constant pitch within a predetermined arrangement pattern. On the other hand, the socket portions 1b, 2b, 3b are sequentially arranged in a constant pitch within the insulating block 6.

The contact conductor 1 has the pin portion 1a and the socket portion 1b belonging to the same contact conductor 1. The arrangement sequence of the pin portions 1a in the insulating block 5 is the same arrangement sequence of the socket portion 1b of the insulating block 6. Both of the pin portion 1a and the socket portion 1b belonging to the same contact conductor 1 own a positional relationship that those pin and socket portions are located on the same line.

To the contrary, the contact conductor 3 owns the pin portion 3a and the socket portion 3b belonging to the same contact conductor 3, and the arrangement sequence of the pin portions 3a in the insulating block 5 is different from that of the socket portion 3b of the insulating block 6. In other words, the pin portion 3a and the socket portion 3b belonging to the same contact conductor 3 own such a positional relationship that the pin portion 3a is positionally shifted from the socket portion 3b by 1 pitch. As represented in FIG. 1, this is because the pin portion 3a of the adjoining contact conductor 3 is not positioned at the position of this pin portion of the terminating contact conductor 2 by utilizing such a fact that there is no pin portion of the terminating contact conductor 3. Similarly, the pin portions 3a of the adjoining contact conductors 3 are arranged in such a way that these conductors are positionally shifted by 1 pitch from their original positions. In this example, positional shifting is performed by folding the intermediate portion of the contact conductor 3 at the hollow portion 5e of the pin fixing portion 5a of the insulating block 5. It is of course possible to employ other positional shifting.

The printed-circuit board 8 is such a printed-circuit board as a ceramics printed-circuit board and a printed-circuit board made of synthetic resin. In this embodiment, a resin board such as glass epoxy resin is employed as a base, and a pattern of printed conductors 9 made of copper and the through hole 7 are formed on this base. Although not shown in this drawing, various sorts of circuit elements are mounted on the printed-circuit board 8. As the circuit elements, LSIs, capacitors, resistors, coils, transistors, and diodes are mounted. A conductor 7a is provided inside the through hole 7. In any of the through holes 7, the conductors 7a are electrically connected to portions of the printed-circuit conductor 9. The contact conductors 1, 2 and 3 are penetrated through this through hole 7. In this printed-circuit board 8, at least two through holes 8a used to penetrate the fixing members 10 for fixing the insulating blocks 5 and 6 are fabricated at the positions where the insulating blocks 5 and 6 of the connector are to be mounted. There through holes 8a are formed at an interval corresponding to the distance between the mounting hole 5f of the insulating block 5 and the mounting hole 5c of the insulating hole 6c.

The connector is mounted on a portion of this printed-circuit board 8. Normally, the connector is arranged near one edge of the printed-circuit board 8. The fixing member 10 is employed to mount/fix the connector on/to the printed-circuit board. This fixing member 10 is constructed of, for instance, a rivet. However, the fixing member is not limited to this member, but may be, for instance, constructed by combining a bolt with a nut.

An example of an assembling sequence of this module will now be explained. First, the contact conductors 1, 2, 3 are mounted on the insulating block 6. Subsequently, while these contact conductors 1, 2, 3 are penetrated through the relevant through holes 7 of the printed-circuit board 8, the insulating block 6 is mounted on the printed circuit board 8. In this case, connection between the contact conductor 1 and the printed conductor 9 is made via the conductor 7a within the through hole 7a. As a consequence, the conductor 7a of the through hole 7 is soldered with the contact conductor 1, if required, at this assembling stage.

Then, the insulating block 5 is mounted on the printed-circuit board 8. At this time, the pin portion 1a of the contact conductor 1 is penetrated through the pin hole 5d under such condition that the pin portion 1a is extended in a straight line. The contact conductor 3 is penetrated through the adjacent pin hole 5d with its pin hole 3a, while the intermediate portion thereof is folded. The pin portion 4a of the contact conductor 4 is set into the pin hole 5d. Therefore, lengths of tip portions of the projected contact conductors 1, 3, 4 are cut with being coincident with each other, resulting in pin portions 1a, 3a and 4a respectively. The lengths of the tip portions of the pin portions 1a, 3a, 4a are cut with being coincident with each other in order that these tip portions are located within the concave portions of the respective insulating blocks 5.

Then, the fixing member 10 passes through the mounting hole 5f of the insulating block 5, the through hole 8a of the printed-circuit board 8, and the mounting hole 6c of the insulating block 6. Both ends of the fixing member 10 are pressured so as to be deformed, thereby being not pulled out. Accordingly, the insulating blocks 5 and 6 are fixed to the printed circuit board 8 by this fixing member 10.

Thus, the insulating blocks 5 and 6 are fixed with the printed-circuit board 8 by way of the fixing member 10, thereby forming an internal shape. In general, the structure realized by the package system as shown in FIG. 1 will be referred to a "module".

FIGS. 2A and 2B represents allocation correspondence among the respective contact conductors and signal lines in the first embodiment. In these drawings, alphabets indicate the allocated signal lines, for illustration purpose.

As indicated in FIGS. 2A and 2B, in this embodiment, there are two pin columns within the frame portion for forming the concave portion of the insulating block, i.e., one pin column to be allocated to the signal lines a, c, e, g, i, k, m, o and q, whereas the other pin column to be allocated to the signal lines b, d, f, h, l, n, p, r, and dummy line. The signal line b, the signal lined, the signal line f, and the signal line h are packaged by the contact conductor 3, and are positioned to the insulating block 5 with being positionally shifted by a single contact conductor (i.e., 1 pitch) with respect to the positions at the insulating block 6. The signal line j which has been given to the original place for the signal line h, is packaged by the terminating contact conductor 2, and then is connected to the printed conductor 9 of the through hole 7 in the printed-circuit board 8. At the position of the insulating block 5, corresponding to that of the signal line b in the insulating block 6, the dummy signal line is located which has been packaged by the dummy contact conductor 4 that is not connected to any of the signal lines in the insulating block 6.

Although the above-described embodiment represent such as example that a signal line is terminated, the present invention is not limited thereto. For instance, the connector of the present invention may be arranged by terminating more than two signal lines.

Referring now to FIG. 3, a description will be made of such an example where a plurality of modules constructed in the above-described manner are stacked.

In FIG. 3, there is shown a cross-sectional view of a condition that a plurality of modules have been stacked via the two-way engagement connector according to the above-described embodiment.

In the stacked structure of FIG. 3, the modules A, B and C are stacked on a printed-circuit mother board 12. Functional components such as LSI are mounted on the printed-circuit mother board 12. A connector 11 for connecting the modules is mounted on this mother board 12 along one edge thereof. To the respective pins of this module connecting connector 11, the signal lines derived from the functional components are connected. The module connecting connector 11 has the socket portions of the connector of the module and the pin portions thereof arranged in the same condition as the socket portions.

Each of these modules owns the same structure as the module shown in FIG. 1. That is, the respective module is arranged by the printed-circuit board 8, and the insulating blocks 5, 6 which are mounted on this board 8 by the fixing member 10 while sandwiching this circuit board 8. Then, it has the contact conductors 1, 2, 3 and 4. The printed conductors and circuit elements (not shown) are mounted on the printed-circuit board 8. The modules A, B and C are sequentially connected via the connectors to each other in the order of the modules A, B and C. It should be noted that the patterns of the printed conductors on the printed-circuit board 8 in the respective modules are specific thereto, whereas the circuit elements mounted on the printed conductors are specific thereto. However, all of the connector portions own the common structure.

With such a structure, the connection relationship for the request signal lines among the respective modules and the functional components 13 will now be explained. It should be understood that although not shown in the drawing, 5 stages of modules A to E have been stacked.

In FIG. 3, as viewed from the printed-circuit mother board 12, such a bus structure is constructed that a bus request signal line jA of the first module A, a request signal line jB of the second module B, a request signal line jC of the third module C, a request signal line jD of the fourth module D, and a request signal line jE of the fifth module E are connected side by side to the functional components 13. As a result, in the respective modules A to E, the same sort of request signal lines are allotted to the contact conductors which place at the same positions. Even when the engaging order between the module A and the module B is reversed to the engaging order shown in FIG. 3, the request signals can independently function, as viewed from the respective modules, without occurring any contradiction.

With respect to stacking of modules with employment of the two-way connector, there is shown an example where the stacked modules are applied to a concrete apparatus, which constitutes a signal line connecting apparatus according to the present invention.

Figure 4:
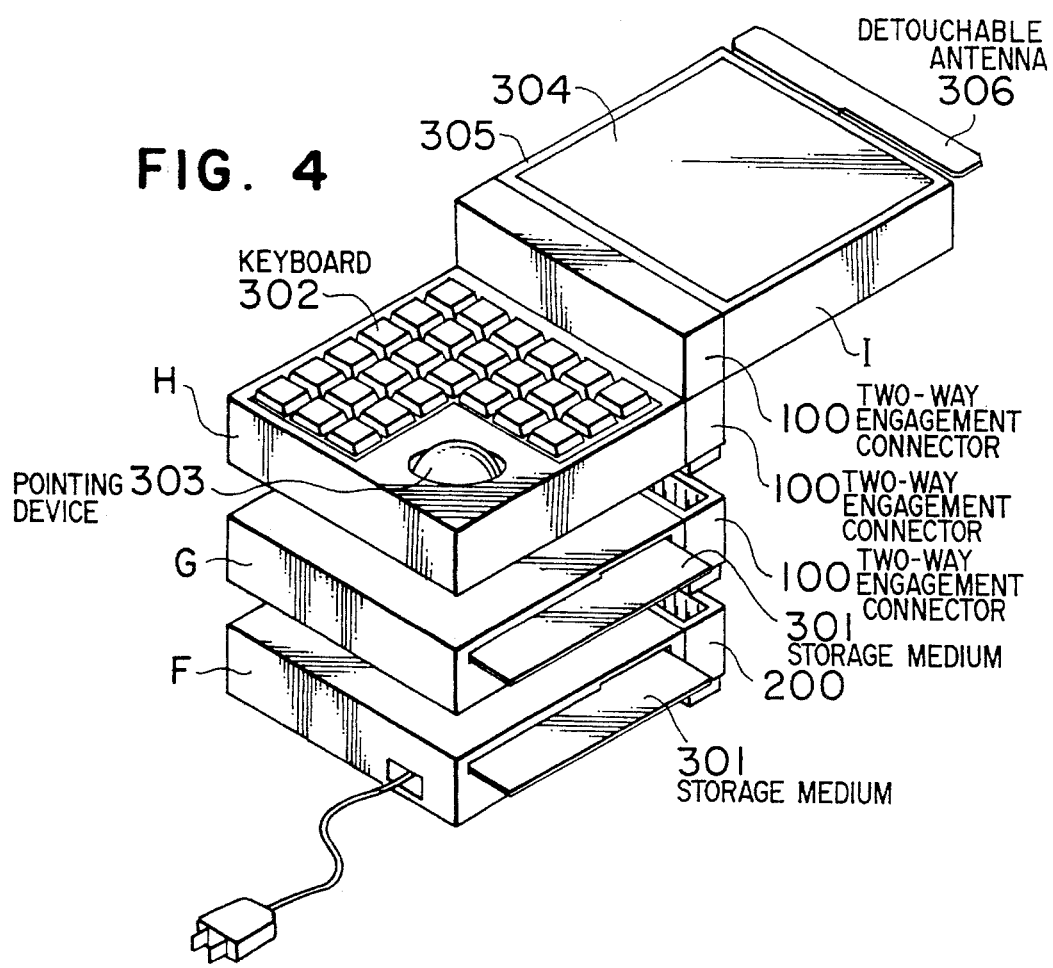
FIG. 4 is a perspective view of a package (mounting) example of a concrete apparatus with employment of the two-way engagement connector constituting the first embodiment of the present invention.

FIG. 4 represents an example of an information processing system arranged by stacking a plurality of modules F to I. In this information processing system, a printer module F equipped with a power source, a storage module G including a harddisk storage device and the like, a CPU module H including a central processing unit (CPU) and the like, and a display module I having a display device and the like are assembled. The module F owns a one-way engagement connector 200, whereas the modules G to I each has a two-way engagement connector 100. The modules F to I are coupled and connected to each other by way of the connectors 200 and 100.

The printer module F equipped with the power supply contains a rectifier, a recharging circuit, a rechargeable battery, a power supply including a power supply circuit for producing a necessary voltage, a printer, and a magnetic disk storage apparatus for driving a recording medium 301 such as a flexible disk (all of them are not shown). The storage module G contains a harddisk storage apparatus and a magnetic disk storage apparatus for driving the storage media 301 such as the flexible disk, the WORM (CD size disk which can be written only once), and the optical disk, although they are not shown in the drawing. The CPU module H has a key board 302 and a pointing device 303 on its upper surface, and a central processing unit (CPU) and a memory. The display module I contains a liquid crystal display device 305 having a touch sensitive panel 304 on its surface, drive devices (not shown either) for driving the touch sensitive panel 304 and the liquid crystal display device 305, a detachable antenna 306 used in a communication, and a communication control apparatus and also a transmitting/receiving apparatus.

With such a structural arrangement, the respective modules may be assembled, if necessary. Also, if a further module is needed to be assembled, then it may be additionally employed, or replaced. It should be noted that the respective modules may be separated in the information processing apparatus of this embodiment when these modules are not used. To this end, it may be so constructed that the back-up power supplies are provided with the respective modules.

Then, there is shown another example where the stacked modules with employment of the two-way connectors are applied to a concrete apparatus, which constitutes the signal line connecting apparatus according to the present invention.

Figure 5:
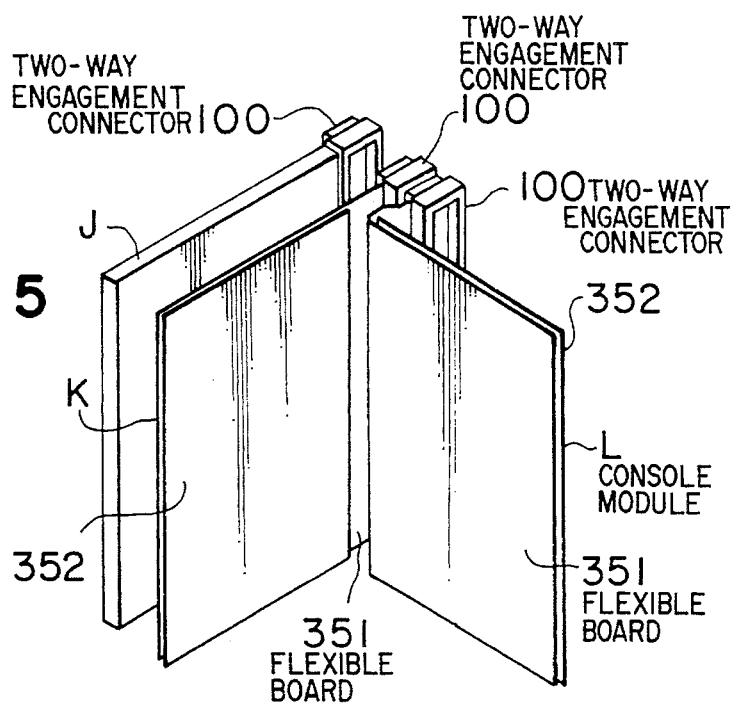
FIG. 5 is a perspective view of a concrete apparatus according to a second embodiment, with employment of the two-way engagement connector constituting the first embodiment of the present invention.

FIG. 5 indicates an example of an information processing system arranged by stacking a plurality of modules J to L. The information processing system of this system may be used as a notebook type information processing apparatus. In this embodiment, the CPU module J having the central processing unit (CPU) and the like, the input/display modules K and L having the touch sensitive panel and the display device and the like are combined with each other. These modules J, K and L are coupled and connected with each other via the two-way connectors 100.

The CPU module J owns the drive apparatus for driving the CPU and the input/display module. The respective input/display modules K and L own the same structure with each other, and a flexible board 351 and an input/display device 352 mounted on this flexible board. As the input/display device, the touch sensitive panel is assembled with the liquid crystal display panel. As the input/display device 352, there are one device for writing information by depressing it by a pen or the like, and the other device for directly displaying information thereon. Also, an operation unit is displayed on a portion of this display device 352, and the respective selection regions of this operation unit are touched by a finger of a user to perform various operation.

As these operations, for instance, there are storing operation of display data, reading operation of this display data, and editing operation of displayed information.

It should be noted that this input/display device 352 may be provided on both sides of the flexible board 351. Not only the input/display modules K and L, but also further modules may be coupled with each other.

In accordance with this embodiment, since the above-described type of connectors are utilized as shown in FIG. 1, even if the coupling order, or sequence of the input/display modules K and L would be reversed to the original coupling order thereof, input/display operations could be correctly performed without any contradiction.

Figure 6:
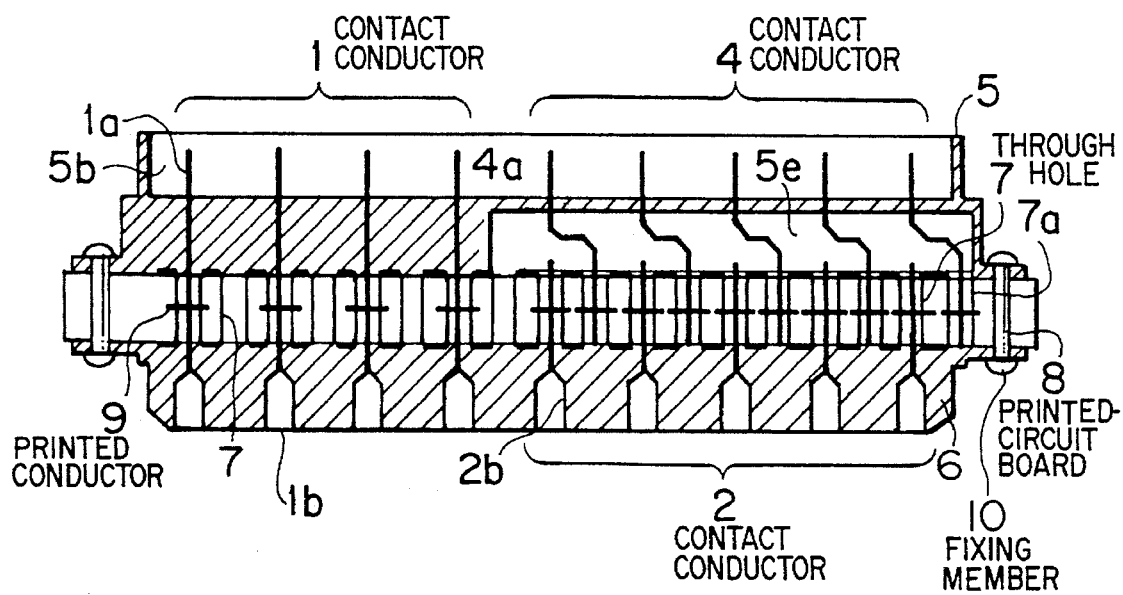
FIG. 6 is a sectional view for representing structures of the two-way engagement connector constituting the second embodiment of the present invention, and of a printed-circuit board for mounting this two-way engagement connector.

In FIG. 6, there is shown a second embodiment of the present invention to which the two-way engagement connector is applied. FIG. 6 is a cross-sectional view of a packaged two-way engagement connector.

This second embodiment includes the printed-circuit board 8 having the printed conductor 9, the insulating blocks 5 and 6 for constituting a connector mounted by sandwiching the printed-circuit board 8, the contact conductors 1, 2, 4 mounted on the insulating blocks 5 and 6, and also the fixing member 10 for fixing the insulating blocks 5 and 6 to the printed-circuit board 8. This embodiment owns such a feature in the contact conductors 2 and 4, and the printed-circuit board 8 for connecting these contact conductors. Other remaining structures of this embodiment are similar to those of the first embodiment. To avoid repeated explanations, only different points will be mainly described in this embodiment.

In this second embodiment, there are provided in addition to the contact conductor 1, a plurality of contact conductors 2 having the socket portions 2b but no pin portions, and a plurality of contact conductors 4 having the pin portions 4a but no socket portions. On the insulating block 6, the socket portions 1b of the contact conductor 1 and the socket portions 2b of the contact conductor 2 are arranged at a constant pitch. On the other hand, the pin portions 1a of the contact conductor 1 and the contact conductors 4a of the contact conductor 4 are arranged on the insulating block 5 at a constant pitch in a similar manner to that of the insulating block 6.

The printed-circuit board 8 includes a plurality of through holes 7 containing conductors 7a therein. A total number of through holes 7 is equal to twice number of the contact conductors 1 as well as summed number of these contact conductors 2 and 4. In other words, these through holes 7 are provided at a half of pin arranging pitch. It should be noted that every one through hole 7 is used by the contact conductors 1, whereas the arranged through holes 7 are alternately are used by the contact conductors 2 and 4.

The contact conductors 4 are folded within a space 5e of the insulating block 5 and are arranged in such a manner that these contact conductors are positionally shifted by ½ pitch to the adjoining positions, which is similar to the contact conductors of the above-explained first embodiment. In other words, each contact conductor 4 is positionally shifted by ½ pitch to the position of the neighbor contact conductor 2, and then the pin portion 4a thereof is projected into a concave portion formed by the frame portion 5b of the insulating block 5 from this position.

The contact conductors 2 except for one to be terminated within this modules, are connected via the conductors 7a of the through hole 7 and the printed conductor 9 to the contact conductors 4. As a result, it is so arranged in a similar manner to the pin positional shifts by the contact conductor 3 according to the first embodiment.

Then, a description will now be made of a third embodiment of the present invention to which the two-way engagement connectors are applied.

Figure 7A:
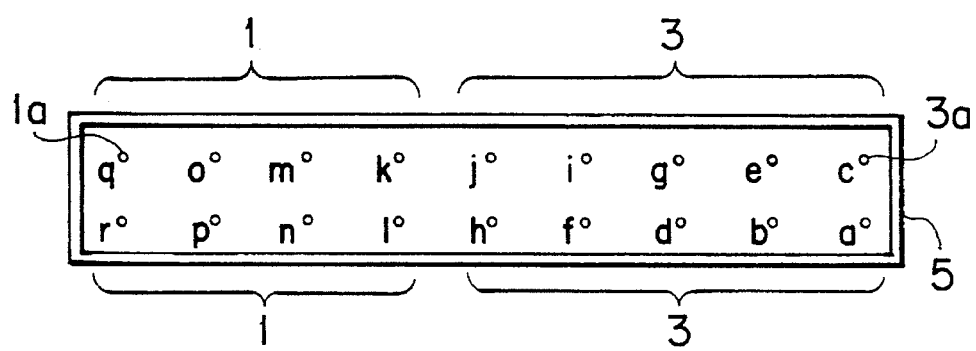
FIGS. 7A and 7B are explanatory diagrams for indicating a pin-portion arrangement and a socket-portion arrangement of a two-way engagement connector utilized in a third embodiments of the present invention, as viewed on the pin-portion side.
Figure 7B:
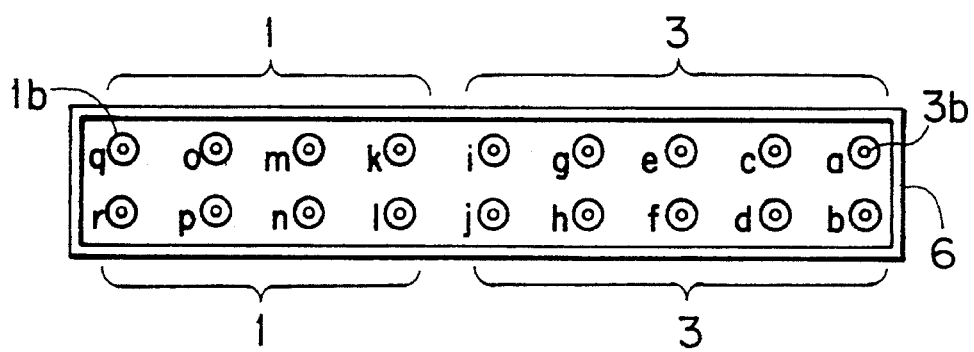

FIGS. 7A and 7B are explanatory diagrams for representing a pin-portion arrangement of the two-way engagement connector and a socket-portion arrangement thereof according to the third embodiment, as viewed from the pin portion side.

Although not shown in these drawings, this third embodiment comprises a printed-circuit board-having a printed conductor; the insulating blocks for sandwiching this printed-circuit board, which is mounted to constitute a connector; the contact conductors 1 and 3 mounted on the insulating blocks 5 and 6; and a fixing member for fixing the insulating blocks 5, 6 and the printed-circuit board. This third embodiment has such a feature existing in a structure for shifting the position of the contact conductor 3 without employing the contact conductors 2 and 4, and other arrangements are similar to those of the first embodiment. To avoid repetition of explanations, only different points are mainly described.

In FIG. 7A and FIG. 7B, the pin portions 1a and 3a of the contact conductors 1 and 3 are arranged on the insulating block 5. On the other hand, the socket portions 1b and 3b of the contact conductors 1 and 3 are arranged on the insulating block 6. Signal lines k, l, m, n, o, p, q and r are allocated to the contact conductor 1, whereas signal lines a, b, c, d, e, f, g, h, i, and j are allocated to the contact conductor 3. It should be understood that alphabets shown in these drawings are names allocated to these signal lines for the sake of convenience.

In the contact conductor 1, the socket portion 1b is not positionally shifted from the pin portion 1a. Accordingly, the allocated positions of the signal lines k, l, m, n, o, p, q, and r which have been allocated to the contact conductor 1 are not changed in the insulating blocks 5 and 6. On the other hand, the pin portion 3a of the contact conductor 3 is positionally shifted by a single conductor in a ring form with respect to the socket portion 3b. The signal lines a, b, c, d, e, f, g, h, i, and j allocated to the contact conductor 3 are sequentially arranged in such an order of a, b, d, f, h, j, i, g, e, and c along a clock wise direction if the arrangement of the socket portion 3b of the insulating block 6 is defined as a reference arrangement, whereas the signal lines are sequentially arranged in the order of c, a, b, d, f, h, j, i, g and e at the pin portion 3a of the insulating block 5, namely are positionally shifted by 1 pitch in a ring form.

A description will now be made of a fourth embodiment of the present invention to which the two-way engagement connectors are applied.

Figure 8A:
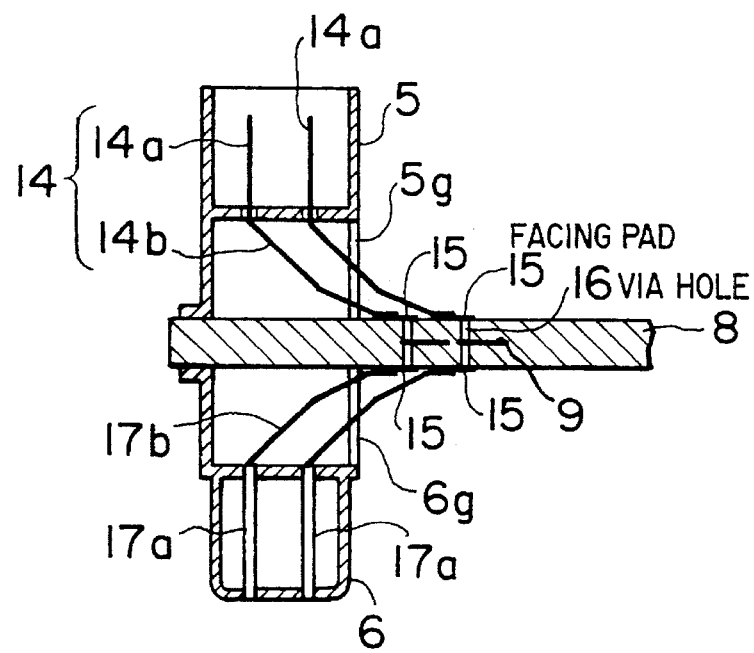
FIGS. 8A and 8B are sectional views of a printed circuit board on which a two-way engagement connector is mounted, which constitutes a fourth embodiment of the present invention.
Figure 8B:
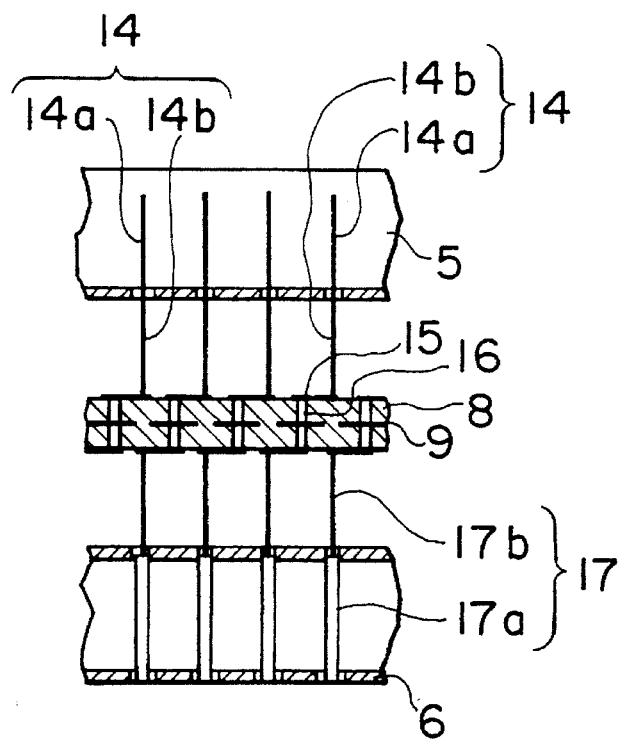

FIGS. 8A and 8B show the fourth embodiment of the present invention. The connector employed in this fourth embodiment has no such a contact conductor penetrating through the printed-circuit board, another contact conductor is subdivided into a first conductor and a second conductor, and connections between these contact conductors are performed at the printed-circuit board.

The present embodiment comprises the printed-circuit board 8 having the printed conductor 9, the insulating blocks 5 and 6 mounted to constitute the connector, while sandwiching the printed-circuit board 8, a contact conductor 14 mounted on the insulating block 5, and a contact conductor 17 mounted on the insulating block 6.

The insulating blocks 5 and 6 according to this fourth embodiment have an opening portion 5g and an opening portion 6g along the same direction, respectively, from which the respective contract conductors 14 and 17 are derived. The contact conductor 14 is constructed of a pin portion 14a, and a lead portion 14b for deriving this pin portion 14a to a predetermined portion of the printed-circuit board 8. The pin portions 14a are arranged along two columns on the insulating block 5. On the other hand, the contact conductor 17 is constructed of a socket portion 17a and a lead portion 17b for pulling out the socket portion 17a to a predetermined portion of the printed-circuit board 8, which are arranged along two columns on the insulating block 6. The contact conductors 17 may be formed in an integral shape.

Facing pads 15 employed in correspondence with the above-described lead portions 14b and 17b, are provided on both surfaces on the printed-circuit board 8, and also via holes 16 are formed thereon in order to connect the corresponding pads 15, 15 positioned on the front/rear surfaces of the board 8. The connecting relationship among these pads and the via holes 16 is established in such a manner that these pads and the via holes corresponding to the contact conductors 1 of the above-described first embodiment are connected in accordance with the positional relationship of the contact conductors, which are connected without any position shifting. On the other hand, as illustrated in FIG. 8B, as to the contact conductor corresponding to the contact conductor 3 in the first embodiment, the via hole 16 is connected not to the pad 15 located at the original position thereof, but to the neighbor pad 15, so that the contact conductor 17 is positionally shifted by a single conductor, namely one pitch to be connected to the contact conductor 14. As a consequence, a similar positional shift to that of the contact conductor 3 according to the first embodiment may be achieved.

Shifting of the signal lines may be performed, for instance, as shown in FIGS. 2A and 2B by the positional shifting. In other words, any of the lead portions is terminated at this board 8 at which position, the neighbor lead portion 17b is positionally shifted and the neighbor lead portions may be successively shifted. Also, it is possible to shift these lead portions as illustrated in FIGS. 7A and 7B.

Figure 9:
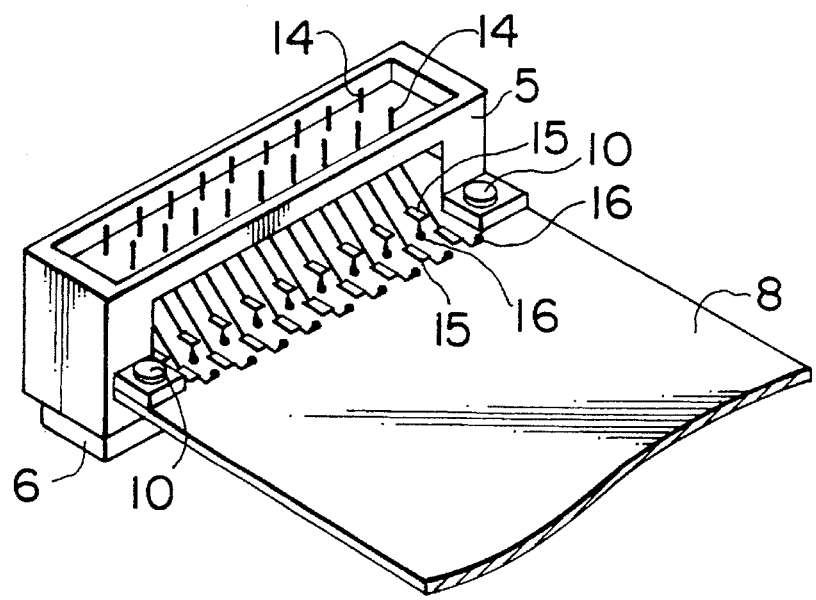
FIG. 9 is a perspective view for indicating a packaging condition of the fourth embodiment of the present invention.

In FIG. 9, there is shown an example where the two-way engagement connector shown in FIG. 8A and FIG. 8B is packaged. In this package example, the insulating block 5 and the insulating block 6 are made in an integral form. The insulating block 5 is fixed to the printed-circuit board 8 by the fixing member 10.

It should be noted that the via holes 16 connected to the facing pads 15 formed in the upper plane and the lower plane of the printed-circuit board 8 shown in FIG. 9 may be subdivided into a via hole connected to the facing pad 15 formed in the upper plane and another via hole connected to the facing pad 15 formed in the lower plane, and a repeater may be connected between two via holes, thereby having an amplification transfer function. A connection function may be connected between these two via holes, instead of the repeater, thereby accomplishing a daisy chain.

Figure 10:
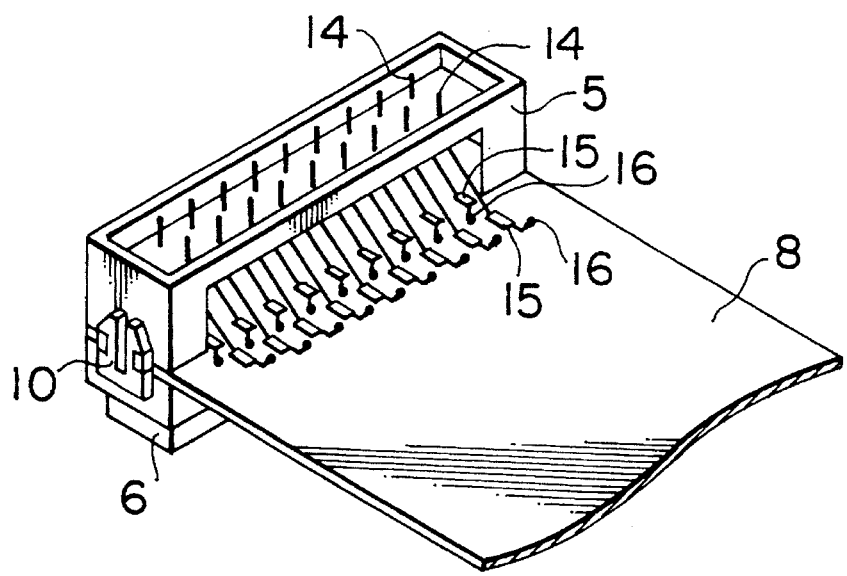
FIG. 10 is a perspective view for showing a packaging condition of two-housing close-fitting type circuit board according to the fourth embodiment of the present invention.

In FIG. 10, there is shown another example of the fourth embodiment when a two-housing fitting type two-way engagement connector is packaged. In the structure of FIG. 10, the insulating block 5 of the connector and the insulating block 6 thereof sandwich the printed-circuit board 8 and are closely fitted with each other by the fixing member 10. These insulating blocks 5 and 6 are engaged with the insulating blocks of other blocks, whereby a plurality of modules may be coupled to each other.

Figure 11:
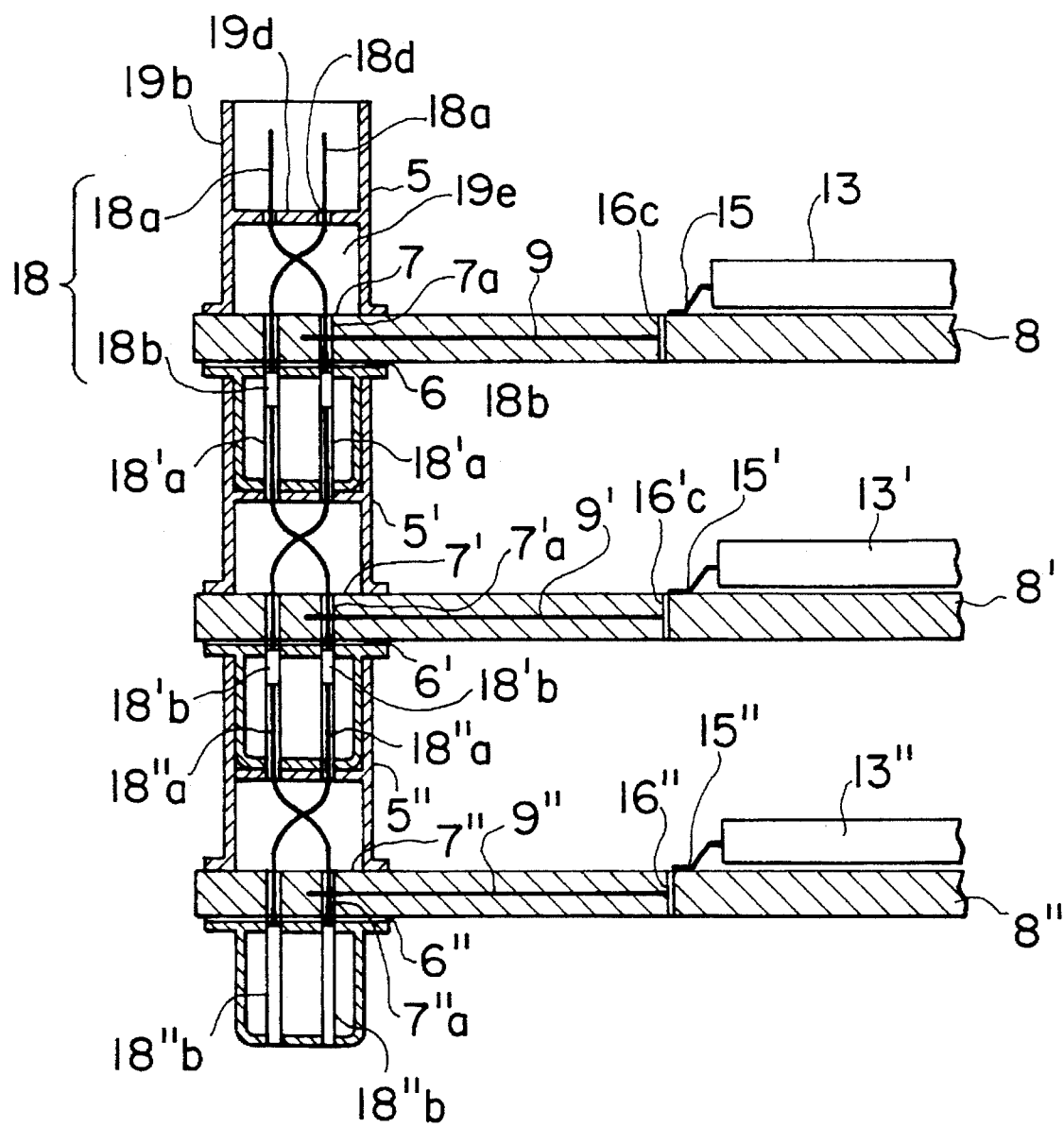
FIG. 11 schematically represents a packaging section of a two-way engagement connection mounted on a printed-circuit board and also a daisy chain connection, which constitutes a fifth embodiment of the present invention.

FIG. 11 represents a structure of a fifth embodiment of the present invention, to which the two-way engagement connector is applied. The fifth embodiment is constructed by staking a plurality of modules. It should be understood that although 3 modules are stacked in FIG. 11, the present invention is not limited thereto.

The modules and connectors of this fifth embodiment includes the printed-circuit board 8 having the printed conductor 9; the insulating blocks 5 and 6 for sandwiching this printed-circuit board 8 and being mounted to constitute the connector, and contact conductors 18 mounted to the insulating blocks 5 and 6.

The contact conductors 18 are provided along two columns under such a condition that a plurality of contact conductors are arranged. The contact conductor 18 has a pin portion 18a at one side and a socket portion 18b at the other side. The contact conductors 18 shown in FIG. 11 are arranged in such a way that the pin portion 18a and the socket portion 18b are replaced by each other in view of a positional relationship. In other words, it is so arranged that the socket portion 18b and the pin portion 18a of the same contact conductor 18 are arranged on the different columns. As a consequence, the pin portion 18a of the contact conductor 18 is positionally shifted by a single conductor. It should be understood that among the contact conductors 18, the socket portions 18b and the pin portions 18a are provided on the same columns without replacing the positional relationship between then as in the contact conductor 1 shown in FIG. 1 of the first embodiment.

The insulating block 5 has an H-shaped form, as viewed in the section thereof, for constituting a frame portion 19b to store the pin portion 18a and to form a concave portion engaged with the insulating block 6 of other connector, and a space 19e to folding the contact conductor 18 in order to change its position. At a position of a web having an H shape of the insulating block 5, a pin hole 19d is provided through which the pin portion 18a is penetrated. A plurality of pin holes 19d are arranged in two columns at a constant pitch.

The insulating block 6 has an outer shape which can be engaged within the concave portion formed by the frame portion 19b of the insulating block 5, and mounts the socket portion 18b.

The printed-circuit board 8 owns the through holes 7 through which the contact conductors 18 are penetrated. In the through holes 7 belonging to one column, conductors 7a for connections are arranged. This conductor 7a is connected to the printed conductor 9 employed on the printed-circuit board 8. This printed conductor 9 is connected via the functional components 13 and the via holes 16, which are mounted on the respective board 8.

In this example, the modules are subdivided into groups, the number of which is equal to that of the contact conductors 18 that have been positionally shifted, as described above, so that these modules realizes as a bus system a function multiplex system.

Figure 12:
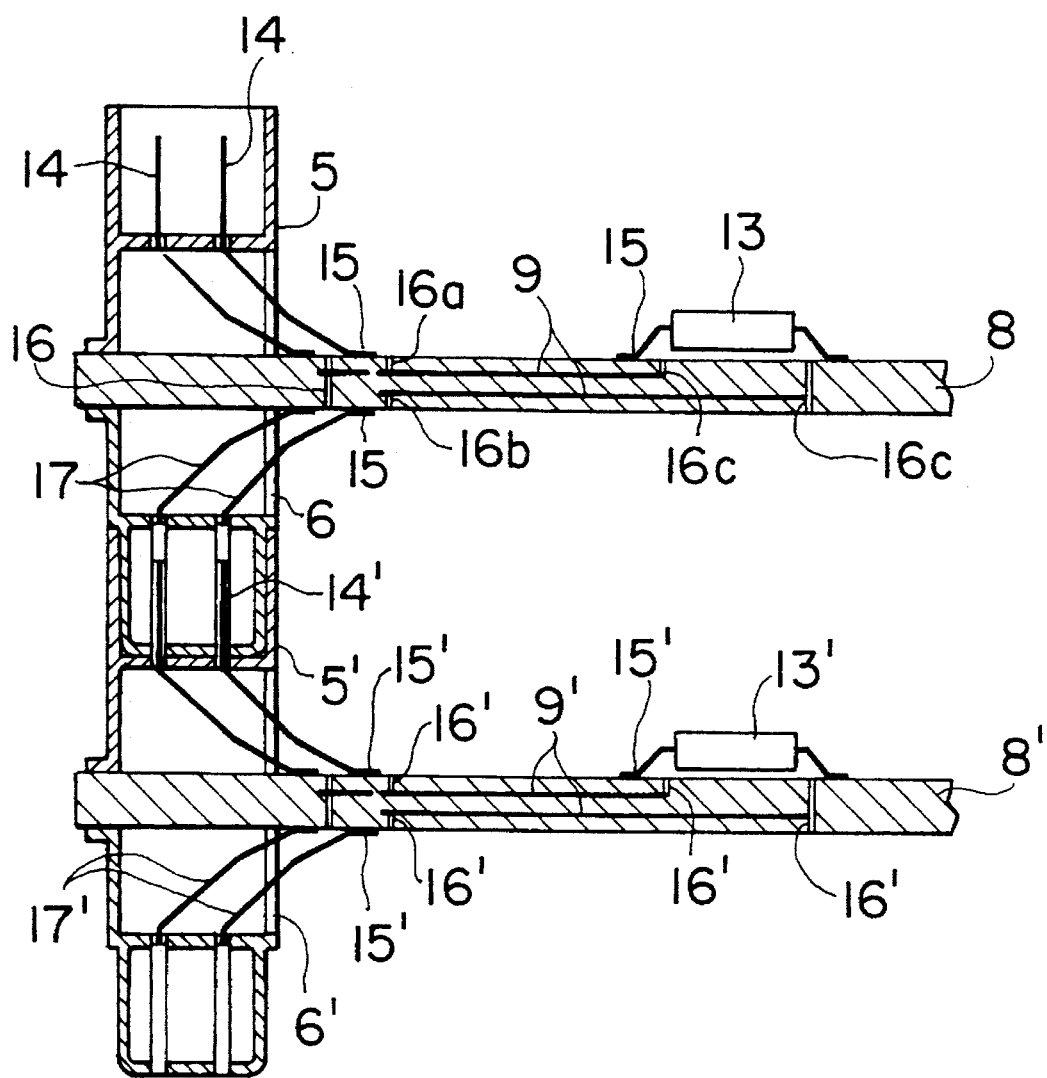
FIG. 12 schematically indicates a multiplexed arrangement of functional components and a packaging section of a two-way engagement connection mounted on a printed-circuit board, which constitutes a sixth embodiment of the present invention.

Then, a module of a sixth embodiment of the present invention, to which the two-way engagement connector is applied, will now be explained with reference to FIG. 12. This sixth embodiment corresponds to a modification of the fourth embodiment shown in FIG. 8, and owns a feature in a connection relationship of contact conductors in a printed-circuit board. In this embodiment, only a different point will be mainly explained so as to avoid repetition of descriptions. In FIG. 12, contact conductors 14 and 17 are provided in two columns, respectively. In the printed circuit board 8, at least two layers of printed conductors 9 are provided. Via holes 16 and facing pads 15, which are used to connect the contact conductors 14 and 17, are formed on the printed-circuit board 8. The via holes connected to one relevant columns of the contact conductors 14 and 17 among these via holes 16, are directly connected to the pads 15 provided on both front and rear surfaces of the substrate 8. The via holes connected to the other relevant columns of the contact conductors 14 and 17 among the via holes 16, are subdivided into via holes 16a connected to the contact conductor 14 and via holes 16b connected to the contact conductor 17. Then, these via holes 16a and 16b are connected through the printed conductors 9 and via holes 16c to functional components 13 mounted on the board 8. Accordingly, the contact conductors 14 and 17 belonging to other columns are connected each other via the functional components 13.

When an interrupt control circuit would be connected as the above-described functional components 13, for instance, a daisy chain type bus could be realized among the coupled modules. Also when an amplifier transfer circuit would be connected as the functional components 13, a bus could be realized via a repeater among the modules. Furthermore, when the functional components 13 would be a protocol converter, a multiprotocol type bus could be realized via a local protocol converter on the bus could be realized. Also, when a crystal oscillator would be equipped with each of these functional components 13, a multiple bus clock may be realized in response to operation frequencies of the respective modules.

Then, a description will now be made of a seventh embodiment of the present invention in which modules are stacked by applying the two-way engagement connectors.

Figure 13A:
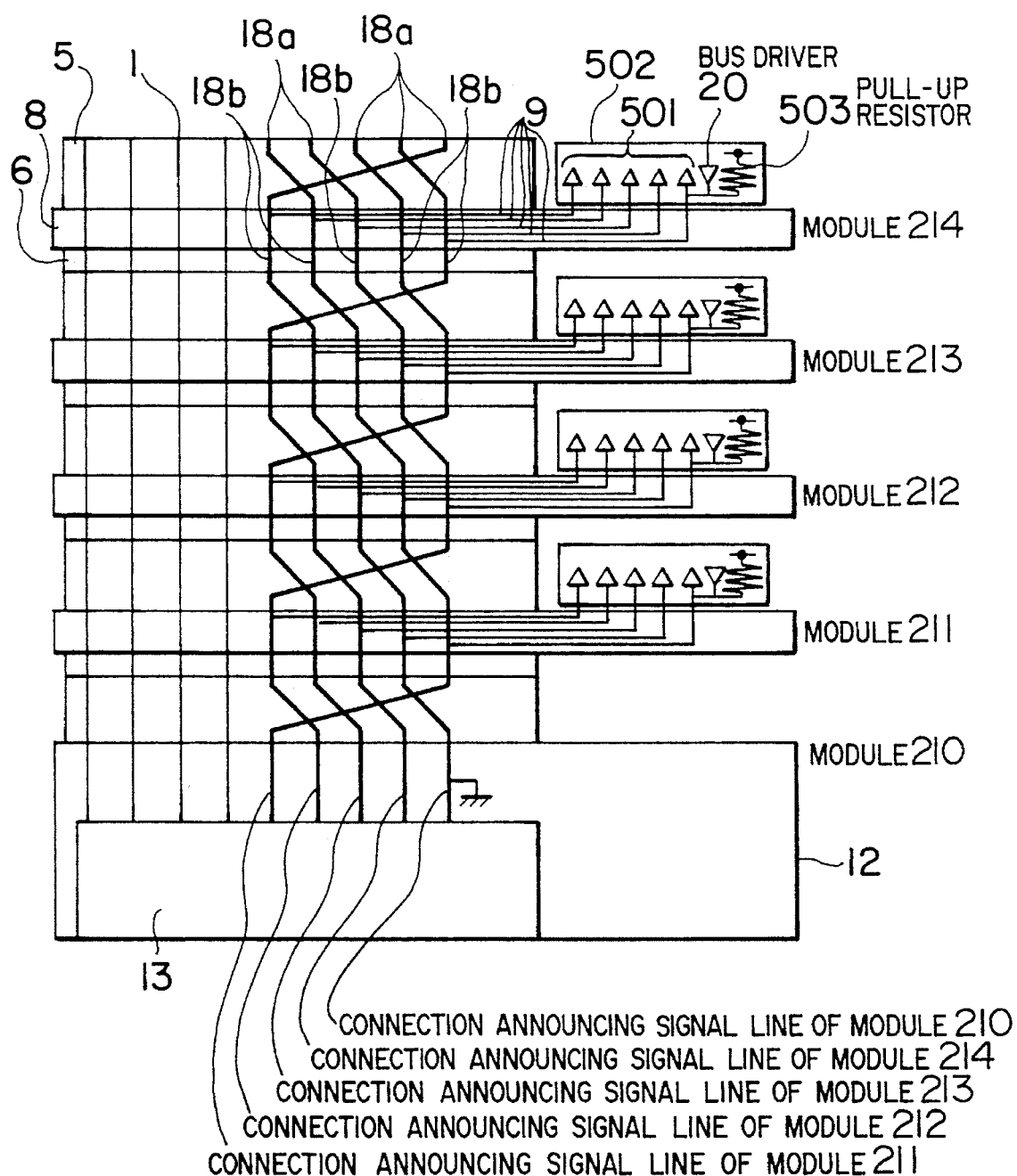
FIGS. 13A and 13B schematically represent a packaging section of a two-way engagement connector mounted on a printed-circuit board, and also a bus used for a connection reporting signal and a request signal, which constitute a seventh embodiment of the present invention.

FIG. 13A schematically shows a packaging condition of the two-way engagement connectors employed in the seventh embodiment. This embodiment is such an example that the functional components 13 are mounted on a plurality modules 210 to 214. Then, the seventh embodiment has such a structure that to position connection announcing signal lines for the respective modules at the same position in the respective substrate, the contact conductors to which this signal line has been allocated are sequentially shifted.

In FIG. 13A, each of these modules has the printed-circuit board 8, and the insulating blocks 5 and 6 mounted thereon to constitute the engaging structural component of the connector by sandwiching the printed-circuit board 8. Further, each of the modules owns the contact conductor 1, the contact positions of which at one surface are identical to the contact positions thereof at the other surface, and a contact conductor 18, the contact positions of which at one surface and the contact positions of which at the other surface are successively shifted to the positions of the adjoining conductors. For instance, with respect to the contact conductor 18, the socket portion 18b located at the rightmost position is positionally shifted to the pin portion 18a located at the second position from the rightmost position, the socket portion 18b located at the second position from the rightmost position is positionally shifted to the pin portion 18a located at the third position from the rightmost position, and such a positional shift is sequentially carried out from the module 210 to the module 214. That is, the positional shift should be performed in such a manner that the socket portion 18b located at the n-th order is shifted to the place for the pin portion 18a located at the (n+1)-th order. It should be noted that the last socket portion 18b located at the n-th order is positionally shifted to the place for the first pin portion 18a. As a consequence, the contact conductors 18 are arranged in such a manner that the contact conductors are positionally shifted by a signal conductor (namely 1 pitch) in a circular form.

The printed-circuit board 8 is provided with the printed conductors 9 to be connected to the above-described contact conductors 18. The printed conductors 9 are connected to the functional component 13.

The functional component 13 includes a bus input buffer 501 connected to each of the printed conductor 9 connected to the respective contact conductors 18, a bus driver 502 connected to the printed conductor 9 connected to the contact conductor 18 which has been allocated to the connector announcement signal line of the own module, and a pull-up resistor 503.

When the modules with the above-described structures are stacked to the module 210 for mounting the functional components 13 thereon, and then are successively connected to each other, the signal levels of the connection announcing signal lines are pulled up by the pull-up resistor 503, thereby becoming "1". As a result, the connection is announced to the functional component 13 of the module #10.

Figure 13B:
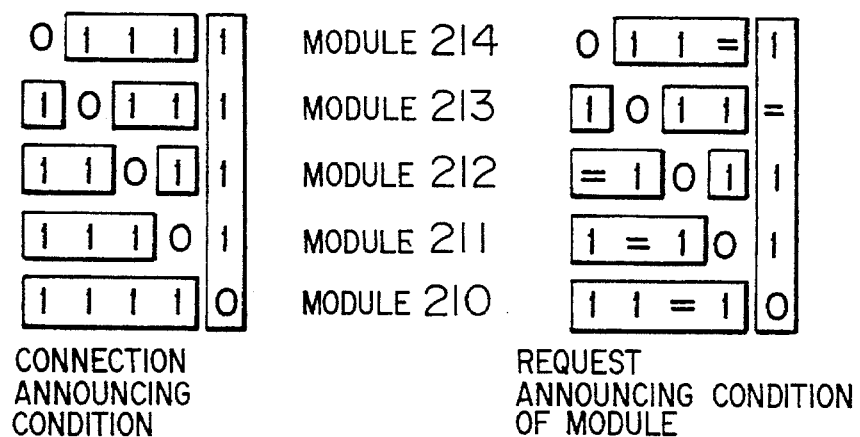

Each of these modules monitors all of the connection announcing signal lines via the bus input buffer of the functional component 13. For instance, as shown in FIG. 13B, when a total number of connection announcing lines whose signal levels have been pulled up by the pull-up resistor 503 and become "1" under connection announcement state, is counted, the respective modules can grasp a total number of modules connected. At the same time, the order from the module 210 may be specified, or defined by the module per se under connection announcing state based upon a total number of connection announcing signal lines whose signal levels have been pulled up to "1" between the connection announcing signal lines whose signal levels have been pulled up by the pull-up resistor 503 and the connection announcing signal line where the module 210 drops the signal level to the ground.

Under request announcing state, the module per se announces its request to the functional component 13 of the module 210 by driving the bus driver 502 connected to the connection announcing signal line whose signal level is pulled up. Other modules monitor this request. FIG. 13B schematically indicates such a condition that the module 213 is requested.

Next, an eighth embodiment of the present invention will now be explained. The eighth embodiment shown in FIG. 14 is different from the above-explained first to seventh embodiments in such that a contact of a signal line is constructed of not the two-way engagement connector, but the contact conductor and the printed circuit of the normal connector.

Figure 14B:
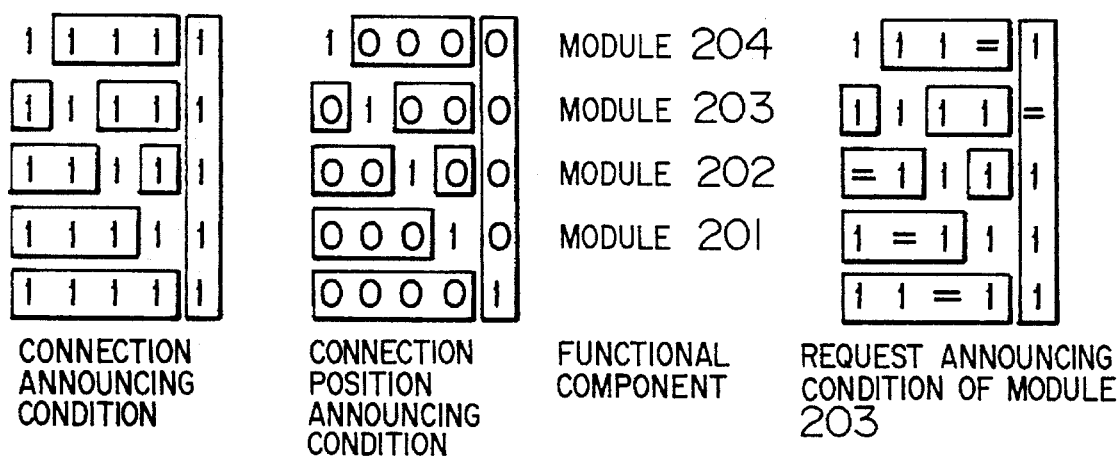
FIGS. 14A and 14B schematically show a printed-circuit mother board and a module board connected to this mother board, which constitutes an eighth embodiment of the present invention.
Figure 14A:
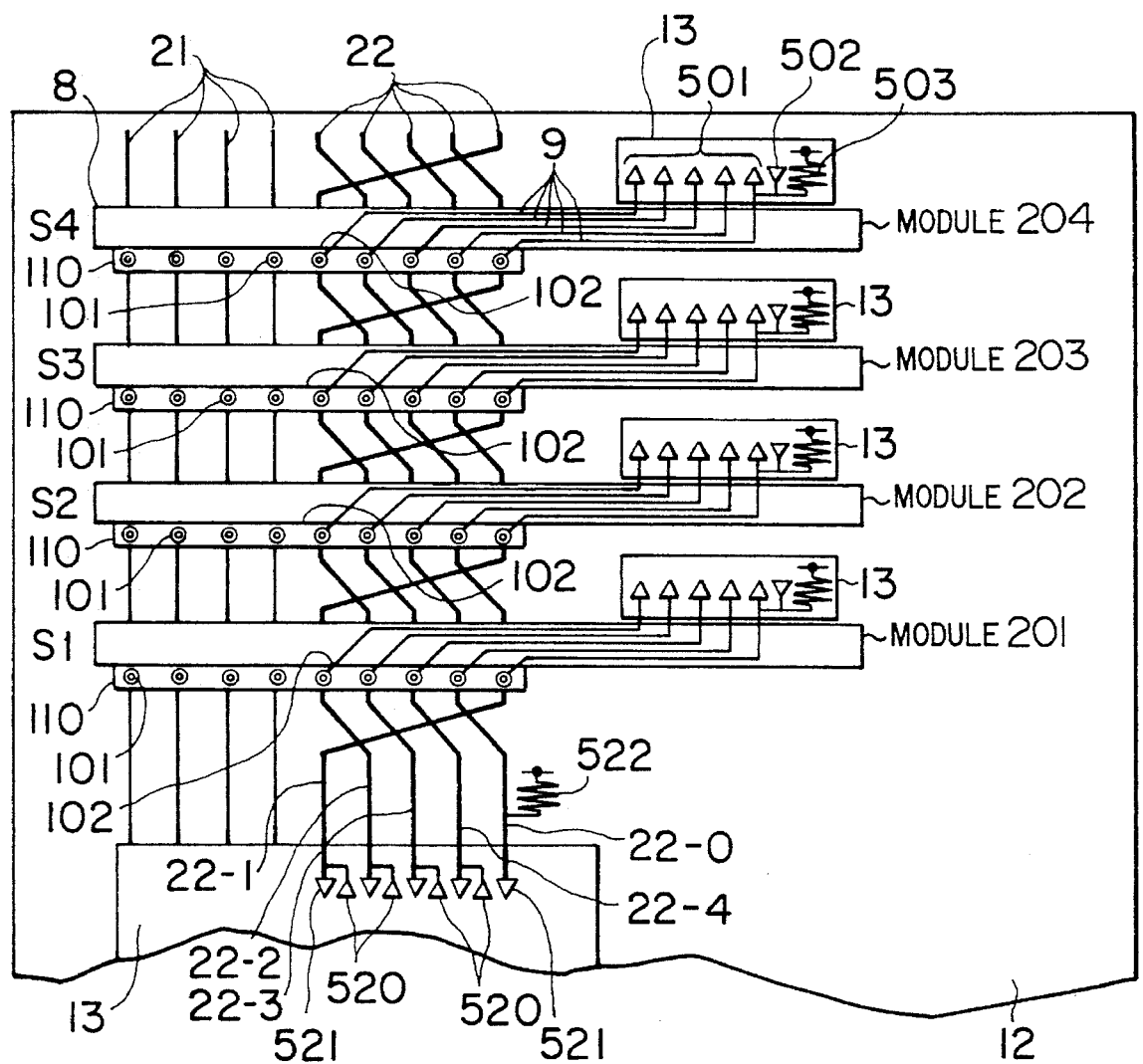

As schematically shown in FIG. 14A, in accordance with this eighth embodiment, a plurality of slots S1 to S4 into which module substrates 201 to 204 are inserted, are provided on a printed-circuit mother board 12, printed-circuit conductors 21 and 22 are provided on this mother board 12, and these printed-circuits 21 and 22 are connected to the respective slots S1 to S4.

The functional component 13 is mounted on the printed-circuit mother board 12. In this functional component 13, a bus driver 520, an input buffer 521, a pull-up resistor 522, and logic circuits (not shown) are provided. These printed-circuit conductors 21 and 22 are connected to the functional component 13. Here, the printed-circuit conductors 22 are allocated to a connection announcing line 22-1 of the module 201, a connection announcing line 22-2 of the module 202, a connection announcing line 22-3 of the module 203, a connection announcing line 22-4 of the module 204, and a connection announcing line 22-5 of the module 205. Then, to the printed-circuit conductors 22 for constituting the connection announcing lines 22-1, 22-2, 22-3, 22-4, the above-described corresponding bus driver 520 and input buffer 521 are connected. Also, to the printed-circuit conductor 22 for constituting the connection announcing line 22-4, the input buffer 521 and the pull-up resistor 522 are connected.

Connectors 110 are arranged to the respective slots S1 to S4. This connector is provided with a socket portion 101 for constituting a contact conductor. This socket portion 101 is connected to the printed-circuit conductors 21 and 22. On the module boards 201 to 204, connectors (not shown) having pin portions for constituting contact conductors are provided in relation to each of these connectors.

The printed-circuit conductors 9 are formed on the module boards 201 to 204 and are connected to the functional components 13.

The functional component 13 includes bus input buffers 501 connected to the respective printed-circuit conductors 9 connected to the respective printed-circuit conductors 22, bus drivers 502 and pull-up resistors 503, which are connected to the printed-circuit conductors 9 connected to the printed-circuit conductors 22 which have been allocated to the connection announcing signal lines of the own module.

The module boards 201 to 204 with the above-described arrangements are connected to each other in accordance with the respective slots S1 to S4 of the printed-circuit mother boards 12. When the respective module boards 201 to 204 are connected thereto, the signal levels of the connection announcement signal lines corresponding to the sequence of the modules are pulled up by the pull-up resistor 503 and then become "1". As a result, the connection is announced to the functional component 13 of the printed-circuit mother board 12.

In each of these module boards 201 to 204, the functional component 13 monitors all of the connection announcing signal lines via the bus input buffer 501. The functional component 13 may grasp the number of modules connected to the bus by counting the number of connection announcing signal lines in the module substrate board per se, the signal levels of the signal lines of which have been pulled up by the pull-up resistors 503. The position of the connected module is grasped by driving the signal level to "0" by the bus driver 502 under connection position announcing state and based upon the order of the connection announcing signal lines, the signal levels of which are kept to "1" by the pull-up resistor 522. Under request announcement condition, the module board per se drives the bus driver 502 connected to the connection announcing signal lines whose signal levels are pulled up by the pull-up resistor 503, thereby announcing the request to the functional component of the module. Other modules monitor this request. A request announcement condition of the module 203 is schematically illustrated in FIG. 14B as one example of these conditions.

As previously explained, in the connector having the engagement directions along two directions, the structure for positionally shifting the corresponding two contact positions is provided for portions of the contact conductors, even when the same sort of signal lines having one-to-one correspondence would be allocated to the contacts located at the same position among the contact columns of the connector in the printed-circuit board for the respective modules, the one-to-one correspondence could be maintained. The multiplexing process and the selection and also management of the functional modules can be realized by employing such a structure to shifting the contact position in a circular form. Furthermore, shifting of the contact positions of the contact conductors may be realized by changing the positions of the printed-circuit conductors on the printed circuit mother board. As a consequence, even when the same sort of signal lines having the one-to-one correspondence would be allocated to the printed circuits located at the same position, such a one-to-one correspondence could be maintained, so that the printed-circuit board for the modules can be commonly used.

In addition, if it is so arranged that the clocks are defined for every multiplexed functional components, and such contact positions are circularly shifted to select the desirable module, a bus where the bus clock can be realized. If it is so constructed that the bus protocol modules having different sorts are selected by the mechanism for circularly shifting the contact positions, the multi-protocol bus could be realized.

When the two-way engagement connector comprising the facing contact and the facing contact is employed, various functional elements may be added between the facing pad of the facing contact and the facing pad of the facing contact. For instance, the interrupt control function may be added. Also with such a structure, the daisy chain may be realized. When an amplifying transfer function is added, the repeater may be realized. Furthermore, when a protocol converter is added, a multi-protocol bus may be realized via a local protocol converter on the bus.

According to the respective embodiments of the present invention, the crystal oscillators are employed for each of the mounted functional components, so that the multi-clock for the bus clock may be realized in response to the operation frequencies of the respective modules.

As previously described, since the functional components having the functions for giving such signals indicative of the connection announcement condition and the request announcement condition are added to the signal lines having the one-to-one correspondence realized by the present invention, it is possible to realize monitoring operations for the number of connected modules, the connection positions, the announcement of connection condition, and the announcement of bus request.

Although the connections of the contact conductors for the signal lines which should be connected to each other in one-to-one correspondence are positionally shifted by 1 pitch in the above-described embodiments, the present invention is not limited thereto. Also, the present invention may be applied to a case that plural pairs of signal lines are shifted.

We claim:

1. A connector for stacking printed circuit boards, comprising:

a plurality of contact conductors;

a first insulating block having first fixing positions for fixing respective ends of said plurality of contact conductors in a predetermined pattern;

a printed-circuit board mounted on said first insulating block, having through holes at positions corresponding to positions of said contact conductors as fixed by said first insulating block, said through holes having at least a portion of said plurality of contact conductors passed therethrough, first printed conductors electrically connected to a first group of said plurality of contact conductors, and second printed conductors terminating a second group of said plurality of contact conductors at predetermined positions;

a second insulating block mounted on another side of said printed-circuit board and having second fixing positions for fixing respective ends of said plurality of contact conductors in the same predetermined pattern as said first insulating block, wherein said first group of said contact conductors is fixed at same said first fixing positions and said second fixing positions on said first and second insulating blocks, and a third group of said contact conductors is fixed on said second insulating block at said second fixing positions displaced by a predetermined pitch from said first fixing positions fixed by said first insulating block.

2. A connector as claimed in claim 1, wherein said third group of said contact conductors is fixed on said second insulating block at said second fixing positions positionally displaced by a single pitch, where a single pitch corresponds to a distance between contact conductors, from said first fixing positions fixed by said first insulating block, and said second group of said contact conductors terminated by said print circuit board is one of said contact conductors.

3. A connector as claimed in claim 1, wherein said third group of said contact conductors has at least one contact conductor fixed at one of said second fixing positions positionally shifted by a multiple pitch greater than a single pitch, where a pitch corresponds to a distance between contact conductors, from one of said first fixing positions fixed by said first insulating block.

4. A connector as claimed in claim 1, wherein adjacent first and second contact conductors in said third group represents a pair of contact conductors, and said first and second contact conductors swap said first fixing positions and said second fixing positions with respect to said first insulating block and said second insulating block.

5. A connector as claimed in claim 1, wherein said contact conductors construct a socket portion at the side of said second insulating block, and a pin portion at the side of said first insulating block, except ones of contact conductors terminated by said printed circuit board.

6. A module for an information processing apparatus using stacked printed circuit boards, comprising:

a plurality of first contact conductors;

a first insulating block for fixing respective ends of said plurality of first contact conductors in a predetermined pattern;

a printed-circuit board mounted on said first insulating block, having first through holes at positions corresponding to positions of said first contact conductors fixed by said first insulating block and at least a portion of said plurality of first contact conductors passing through said first through holes, second through holes provided corresponding to a part of said first through holes, and printed conductors electrically connected to said plurality of first contact conductors passing through said first through holes, said printed conductors terminating at least one of said plurality of first contact conductors at a predetermined position;

a second insulating block mounted on another side of said printed-circuit board and having second fixing positions for fixing respective ends of a plurality of contact conductors in the same predetermined pattern as said first insulating block;

a plurality of second contact conductors passing through said second through holes and being connected with said first contact conductors in said first through holes corresponding to said second through holes by said printed conductors, respectively, wherein said first contact conductors are fixed at same said first fixing positions and said second fixing positions on said first and second insulating blocks, and said second contact conductors are fixed on said second insulating block at said second fixing positions moved by a predetermined pitch from said first fixing positions fixed by said first insulating block.

7. A module for an information processing apparatus as claimed in claim 6, wherein said second contact conductors are fixed on said second insulating block at said second fixing positions shifted by a distance equal to a distance between adjacent contact conductors from said first fixing positions to which said second contact conductors are connected.

8. A module for an information processing apparatus as claimed in claim 6, wherein a number of said second contact conductors is equal to a number of said first contact conductors terminated by said print circuit board.

9. A module for an information processing apparatus using stacking printed circuit boards, comprising:

a plurality of contact conductors;

a first insulating block having first fixing positions for fixing said plurality of contact conductors in a predetermined pattern;

a printed-circuit board mounted on said first insulating block, having a plurality of first through holes through which at least a portion of said plurality of contact conductors are passed, and printed conductors electrically connected to said plurality of contact conductors passed through said first through holes, said printed conductors terminating at least one contact conductor of said plurality of contact conductors at a predetermined position;

a second insulating block mounted on another side of said printed-circuit board and having second fixing positions for fixing respective ends of a plurality of contact conductors in the same predetermined pattern as said first insulating block, and having ones of said contact conductors which are not connected to said print conductors, connected at positions positionally shifted in turn to positions of said contact conductors which are terminated by said print conductors.

10. A module unit, including at least two stacked modules for an information processing apparatus as claimed in claim 9, further comprising:

at least one electronic component mounted on said printed circuit board in each of said stacked modules, being connected with ones of said printed conductors connected with ones of said contact conductors, and connected with ones of printed conductors which connected with ones of said terminated contact conductors on each of said stacked modules.

* * * * *